(12) United States Patent
Moriyama et al.

(10) Patent No.: US 10,329,687 B2
(45) Date of Patent: Jun. 25, 2019

(54) METHOD FOR PRODUCING GROUP III NITRIDE SEMICONDUCTOR INCLUDING GROWING GROUP III NITRIDE SEMICONDUCTOR THROUGH FLUX METHOD

(71) Applicant: TOYODA GOSEI CO., LTD., Kiyosu-shi (JP)

(72) Inventors: Miki Moriyama, Kiyosu (JP); Shiro Yamazaki, Kiyosu (JP); Yasuhide Yakushi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/696,269

(22) Filed: Sep. 6, 2017

(65) Prior Publication Data
US 2018/0066378 A1     Mar. 8, 2018

(30) Foreign Application Priority Data
Sep. 6, 2016 (JP) ................. 2016-174068

(51) Int. Cl.
*C30B 19/10* (2006.01)
*C30B 19/02* (2006.01)
(Continued)

(52) U.S. Cl.
CPC .............. *C30B 19/02* (2013.01); *C23C 16/34* (2013.01); *C23C 16/45525* (2013.01);
(Continued)

(58) Field of Classification Search
CPC .... C30B 9/00; C30B 9/04; C30B 9/08; C30B 9/10; C30B 9/12; C30B 19/00;
(Continued)

(56) References Cited

U.S. PATENT DOCUMENTS 9,017,479 B2 *  4/2015  Iwai ................... C30B 9/10
                                                                   117/200
2009/0267190 A1 * 10/2009 Fujiwara ............... C30B 9/12
                                                                   257/615
(Continued)

FOREIGN PATENT DOCUMENTS

JP         2012-197194 A    10/2012
WO   WO-2015137266 A1 *  9/2015 ............... C30B 9/12

*Primary Examiner* — Kenneth A Bratland, Jr.
(74) *Attorney, Agent, or Firm* — McGinn I. P. Law Group, PLLC.

(57) ABSTRACT

To reduce ungrown region or abnormal grain growth region in growing a Group III nitride semiconductor through a flux method. A seed substrate has a structure in which a Group III nitride semiconductor layer is formed on a ground substrate as a base, and a mask is formed on the Group III nitride semiconductor layer. The mask has a plurality of dotted windows in an equilateral triangular lattice pattern. A Group III nitride semiconductor is grown through flux method on the seed substrate. Carbon is placed on a lid of a crucible holing the seed substrate and a molten mixture so that carbon is not contact with the molten mixture at the start of crystal growth. Thereby, carbon is gradually added to the molten mixture as time passes. Thus, ungrown region or abnormal grain growth region is reduced in the Group III nitride semiconductor crystal grown on the seed substrate.

20 Claims, 9 Drawing Sheets

(51) Int. Cl.
  *H01L 21/02* (2006.01)
  *H01L 21/78* (2006.01)
  *C30B 29/40* (2006.01)
  *C30B 19/12* (2006.01)
  *C23C 16/34* (2006.01)
  *C23C 16/56* (2006.01)
  *C23C 16/455* (2006.01)

(52) U.S. Cl.
  CPC .............. *C23C 16/56* (2013.01); *C30B 19/12* (2013.01); *C30B 29/406* (2013.01); *H01L 21/0242* (2013.01); *H01L 21/0254* (2013.01); *H01L 21/02389* (2013.01); *H01L 21/02458* (2013.01); *H01L 21/02625* (2013.01); *H01L 21/02628* (2013.01); *H01L 21/02642* (2013.01); *H01L 21/02647* (2013.01); *H01L 21/7813* (2013.01)

(58) Field of Classification Search
  CPC ......... C30B 19/02; C30B 19/06; C30B 19/10; C30B 19/106; C30B 19/12; C30B 29/00; C30B 29/10; C30B 29/40; C30B 29/403; C30B 29/406; C23C 16/34; C23C 16/45525; C23C 16/56; H01L 21/0242; H01L 21/02458; H01L 21/0254; H01L 21/02642; H01L 21/7813
  USPC ... 117/11, 54, 56, 58–59, 63–65, 67, 73–74, 117/76–79, 902, 906, 937, 952
  See application file for complete search history.

(56) References Cited

U.S. PATENT DOCUMENTS

| | | | |
|---|---|---|---|
| 2010/0059717 A1* | 3/2010 | Mori | C30B 19/02 252/506 |
| 2013/0199438 A1* | 8/2013 | Nagai | C30B 19/12 117/58 |
| 2014/0363954 A1* | 12/2014 | Kumegawa | H01L 21/02658 438/498 |
| 2016/0355945 A1* | 12/2016 | Imai | C30B 9/12 |

* cited by examiner

METHOD FOR PRODUCING GROUP III NITRIDE SEMICONDUCTOR INCLUDING GROWING GROUP III NITRIDE SEMICONDUCTOR THROUGH FLUX METHOD

BACKGROUND OF THE INVENTION

Field of the Invention

The present invention relates to a method for producing a Group III nitride semiconductor through a flux method.

Background Art

As a method for growing a Group III nitride semiconductor crystal, a flux method is known, in which nitrogen is dissolved in a molten mixture of alkali metal and Group III element such as Ga, and a Group III nitride semiconductor is epitaxially grown in liquid phase. A flux method in which Na (sodium) is generally used as alkali metal, is referred to as the Na flux method.

In the Na flux method, a seed substrate (template substrate) having a GaN layer grown through MOCVD or a similar technique on a ground substrate made of sapphire or a similar material is employed, and GaN is grown on the seed substrate. When such a seed substrate is employed, a part of the GaN layer is removed to form a periodic dotted pattern, or the surface of the GaN layer is covered with a mask, and windows are formed in a periodic dotted pattern on the mask to thereby expose the surface of the GaN layer. When the seed crystal regions (regions as a starting point of GaN crystal growth) are dotted, there are the following advantages.

Firstly, the seed substrate and the grown GaN can be easily separated by stress or strain due to difference between the linear expansion coefficients of ground substrate and GaN. Secondly, at an initial growth stage, GaN is laterally grown on the dotted seed crystal regions, and then the dotted GaNs are grown so as to be integrated into one. Dislocation is bent in the lateral growth, thereby reducing the dislocation density and improving the GaN crystallinity.

Japanese Patent Application Laid-Open (kokai) No. 2012-197194 discloses that a seed substrate having GaNs as seed crystal regions dotted in a triangular lattice pattern on a ground substrate is employed. By dotting the seed crystal regions in such a pattern, crystal distortion and warpage can be reduced.

However, when GaN is grown on the seed substrate, ungrown region or abnormal grain growth region may occur. Here, ungrown region is a region where GaN is not grown at all and there is no GaN on the seed substrate. Holes are formed in the grown GaN, and the ground substrate of the seed substrate is exposed in some cases. Moreover, abnormal grain growth region is a region where crystal grains are extremely large compared to other regions. There was a problem that particularly when the seed substrate having seed crystal regions scattered in a dotted pattern is employed, the occurrence of ungrown region or abnormal grain growth region is increased, and the larger the diameter of the seed substrate, the more remarkably worsened the yield ratio. Even if there is no ungrown region or abnormal grain growth region, there was a significant quality problem that there is variations in the crystal size or shape due to non-uniform growth from each seed crystal region.

SUMMARY OF THE INVENTION

In view of the foregoing, an object of the present invention is to improve crystallinity or yield ratio of Group III nitride semiconductor by reducing ungrown region or abnormal grain growth region when a Group III nitride semiconductor crystal is grown through a flux method.

The present invention relates to a method for producing a Group III nitride semiconductor to grow a Group III nitride semiconductor through a flux method using a molten mixture of an alkali metal and a Group III metal on a seed substrate, wherein the carbon concentration of the molten mixture is made to zero before the start of growth, and a Group III nitride semiconductor is grown on the seed substrate while increasing the carbon concentration of the molten mixture after the start of growth.

To make the carbon concentration of the molten mixture zero before the start of growth and increase the carbon concentration of the molten mixture after the start of growth, for example, carbon is placed so as not to contact with the molten mixture at the start of growth. This can easily increase the carbon concentration.

To place carbon so as not to contact with the molten mixture at the start of growing, carbon is placed outside a first crucible for holding the molten mixture. For example, carbon is placed on a lid of the first crucible. Alternatively, a second crucible for holding carbon is employed and the second crucible is placed in proximity to the first crucible. In this case, addition of carbon to the molten mixture 21 can be controlled by a distance between the first crucible and the second crucible.

When powdered carbon is used, carbon is preferably wrapped in a mesh made of a material capable of withstanding the high temperature such as SUS, MO (molybdenum), and W (tungsten). This can prevent dispersion of carbon, thereby achieving more stable growth of Group III nitride semiconductor.

The seed substrate may have any structure. A free-standing Group III nitride semiconductor substrate or a template substrate having Group III nitride semiconductor layer deposited on a ground substrate may be used. Particularly, a substrate having seed crystal regions as starting points of epitaxial growth scattered in a dotted pattern. This can decrease the dislocation density and improve the crystallinity of Group III nitride semiconductor. Moreover, this can easily separate the seed substrate and the grown Group III nitride semiconductor after the completion of growth. When the seed crystal regions are scattered in a dotted pattern, ungrown region or abnormal grain growth region are easy to occur. However, the present invention can efficiently reduce occurrence of these regions.

As a structure in which the seed crystal regions are scattered in a dotted pattern, for example, a seed substrate having the following structure may be employed. The seed substrate has a ground substrate, a Group III nitride semiconductor layer disposed on the ground substrate, and a mask disposed on the Group III nitride semiconductor layer, and the mask may have a plurality of windows arranged in a triangular lattice pattern.

The mask is preferably formed through ALD. The mask can be formed so as to be dense and have a uniform thickness, thereby preventing the disappearance of the mask due to melting back at an initial growth stage of Group III nitride semiconductor crystal through a flux method. The mask may be made of $Al_2O_3$, $TiO_2$, or $ZrO_2$.

The diameter of the seed substrate is preferably two inches or more. The larger the diameter of the seed substrate, the higher the occurrence of ungrown region or abnormal grain growth region. When the diameter exceeds two inches, this tendency is remarkable. In the present invention, even if the seed substrate having a diameter of two inches or more is employed, ungrown region or abnormal grain growth region can be reduced. The seed substrate having a diameter of three inches or more is especially preferably employed.

According to the present invention, ungrown region or abnormal grain growth region can be reduced, the crystallinity of Group III nitride semiconductor can be improved, and the yield ratio can also be improved. Moreover, a Group III nitride semiconductor is uniformly grown from each seed crystal region, thereby improving the surface flatness of the Group III nitride semiconductor crystal after the completion of growth.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

In the method for producing a Group III nitride semiconductor according to the present invention, a Group III nitride semiconductor is grown through a flux method. Firstly, an outline of a flux method will be described.

(Outline of Flux Method)

The flux method employed in the present invention is a method for epitaxially growing a Group III nitride semiconductor in liquid phase by supplying and dissolving a gas containing nitrogen in a molten mixture containing an alkali metal as a flux and a Group III metal as a raw material. In the present invention, a seed substrate 1 is placed in a molten mixture, and a Group III nitride semiconductor crystal is grown on the seed substrate 1.

The Group III metal as a raw material is at least one species of Ga (gallium), Al (aluminum), and In (indium). Composition of the Group III nitride semiconductor being grown can be adjusted depending on the ratio of the Group III metals. Among them, only Ga is particularly preferred.

The alkali metal as a flux is generally Na (sodium). However, K (potassium) may also be used, or a mixture of Na and K may also be used. Alternatively, Li (lithium) or an alkaline earth metal may be used in combination with the alkali metal.

C (carbon) is not directly added to the molten mixture. C is indirectly added to the molten mixture by the method to be described later. Although C is not added to the molten mixture at an initial stage of crystal growth, C is gradually added to and increased in the molten mixture as time passes. Through addition of C, nitrogen solubility is enhanced, thereby crystal growth rate can be enhanced.

To the molten mixture, a dopant other than C may be added for controlling physical properties (e.g., conduction type and magnetism) of the Group III nitride semiconductor to be grown, promoting crystal growth, suppressing formation of miscellaneous crystals, controlling growth direction, etc. For example, Ge (germanium) or the like may be used as an n-type dopant, and Zn (zinc), Mg (magnesium), or the like may be used as a p-type dopant.

The gas containing nitrogen is a gas of a compound containing nitrogen as an essential element (e.g., molecular nitrogen or ammonia), or a mixture of such gases. Alternatively, the nitrogen-containing gas may be diluted with an inert gas (e.g., rare gas).

(Structure of Seed Substrate)

In the method for producing a Group III nitride semiconductor according to the present invention, a seed substrate (seed crystal) 1 is placed in a molten mixture, and a Group III nitride semiconductor is grown on the seed substrate 1. The seed substrate 1 may have any structure. A free-standing substrate made of Group III nitride semiconductor or a template substrate having Group III nitride semiconductor layer deposited on a ground substrate may be employed. A seed substrate 1 having the structure described below is particularly preferred.

Figure 1:
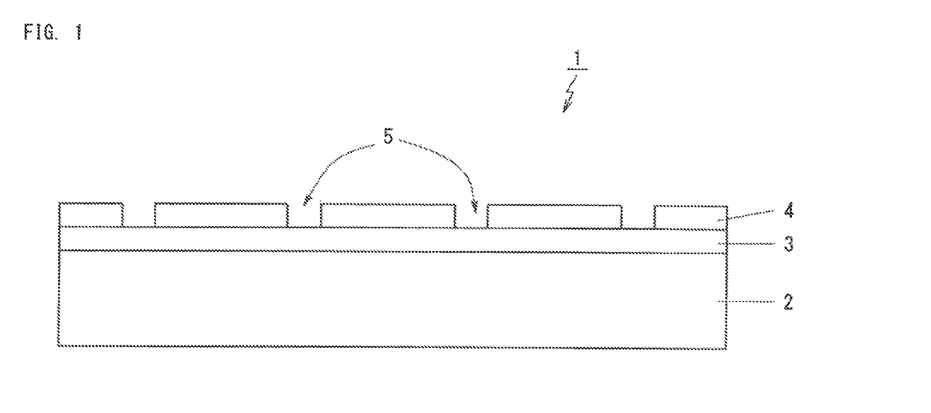
FIG. 1 is a sectional view showing the structure of a seed substrate.

As shown in FIG. 1, the seed substrate 1 has a structure in which a Group III nitride semiconductor layer 3 is formed via a buffer layer (not illustrated) on a ground substrate 2 as a base, and a mask 4 is formed on the Group III nitride semiconductor layer 3. The mask 4 has a plurality of windows 5 in a dotted pattern. By exposing the surface of the Group III nitride semiconductor layer 3 through the windows 5, seed crystal regions (that is, the surface of the Group III nitride semiconductor layer 3 as a starting point of epitaxial growth of Group III nitride semiconductor) are scattered in a dotted pattern.

The Group III nitride semiconductor is laterally grown at an initial stage of crystal growth by scattering the seed crystal regions in a dotted pattern, and the dislocation density is reduced by bending the dislocations, thereby improving the crystal quality. Moreover, the seed substrate 1 and the grown Group III nitride semiconductor crystal can be easily separated after the completion of crystal growth.

The seed crystal regions may be scattered in a dotted pattern by forming trenches on the Group III nitride semiconductor layer 3 through etching.

The mask 4 may be formed through any method such as ALD (Atomic layer deposition), CVD (Chemical Vapor Deposition), and sputtering. ALD is particularly preferred. The mask 4 can be formed so as to be dense and have a uniform thickness, thereby suppressing melting of the mask during crystal growth through a flux method. The mask 4 may be formed of any material as long as it has flux resistance and a Group III nitride semiconductor is not grown on the mask 4, for example, $Al_2O_3$, $TiO_2$, and $ZrO_2$. The thickness of the mask 4 is preferably 10 nm to 500 nm.

Figure 2:
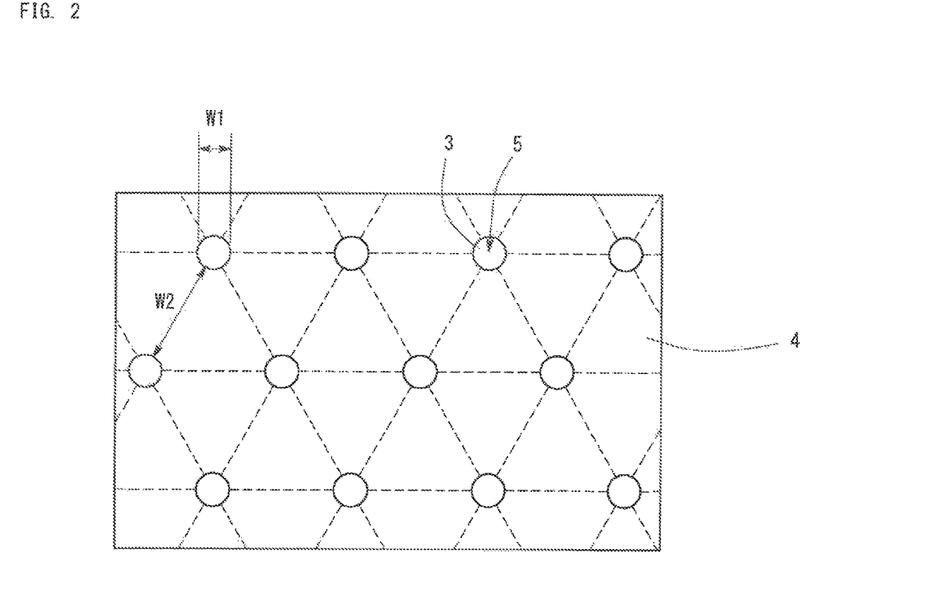
FIG. 2 is a plan view from the above of the seed substrate.

The windows 5 of the mask 4 are preferably arranged in a periodic pattern. An equilateral triangular lattice pattern as shown in FIG. 2, is particularly preferred. The orientation of each side of equilateral triangles is preferably m-axis <10-10> of the Group III nitride semiconductor layer 3. By arranging the windows 5 in such a pattern, the Group III nitride semiconductor is homogenously grown on each seed crystal region, thereby improving the crystal quality of the Group III nitride semiconductor.

Each window 5 may have any shape such as circle, triangle, rectangle, and hexagon. However, the shape of each window 5 is preferably a circle or a regular hexagon to achieve more uniform crystal growth on the surface of the Group III nitride semiconductor layer 3 exposed in each window 5. When the shape of each window 5 is a hexagon (i.e., hexagonal column), the orientation of each side surface is preferably a m-plane of the Group III nitride semiconductor layer 3.

The diameter W1 of each window 5 is preferably 10 μm to 2,000 μm. The interval W2 between the windows 5 (the closest distance between the contours) is preferably 10 μm to 2,000 μm. By setting W1 and W2 within such a range, the grown Group III nitride semiconductor crystal can be easily separated from the seed substrate 1 after the completion of crystal growth.

The ground substrate 2 may be made of any material which a Group III nitride semiconductor can be grown on the surface of the substrate. However, a material not containing Si is preferably used because when Si is dissolved in the molten mixture, crystal growth of Group III nitride semiconductor is hindered. For example, sapphire, ZnO, or spinel may be used.

The diameter of the ground substrate 2 is preferably two inches or more. The larger the diameter of the ground substrate 2, the easier the occurrence of ungrown region or abnormal grain growth region, thereby the effect of suppressing such regions is enhanced by the present invention. When the diameter of the ground substrate 2 is 3 inches or more, the present invention is particularly effective.

The Group III nitride semiconductor layer 3 on the ground substrate 2 is preferably made of a material having the same composition as that of the Group III nitride semiconductor to be grown. GaN is particularly preferred. The Group III nitride semiconductor layer 3 may be grown through any method such as MOCVD, HVPE, and MBE. However, MOCVD or HVPE is preferably employed in terms of crystallinity or growth time.

The thickness of the Group III nitride semiconductor layer 3 is preferably 2 μm or more. In the flux method, the Group III nitride semiconductor layer 3 may undergo melting back at an initial stage of crystal growth. Therefore, the Group III nitride semiconductor layer 3 needs to have a thickness such that the ground substrate 2 is not exposed even if the Group III nitride semiconductor layer 3 is melted back. As used herein, melting back refers to dissolving the Group III nitride semiconductor in the molten mixture to remove it. However, when the Group III nitride semiconductor layer 3 is too thick, warpage occurs on the seed substrate 1. Therefore, the thickness of the Group III nitride semiconductor layer 3 is preferably 10 μm or less.

(Structure of Crystal Production Apparatus)

In the method for producing a Group III nitride semiconductor according to the present invention, for example, a crystal production apparatus having the following structure is employed.

Figure 3:
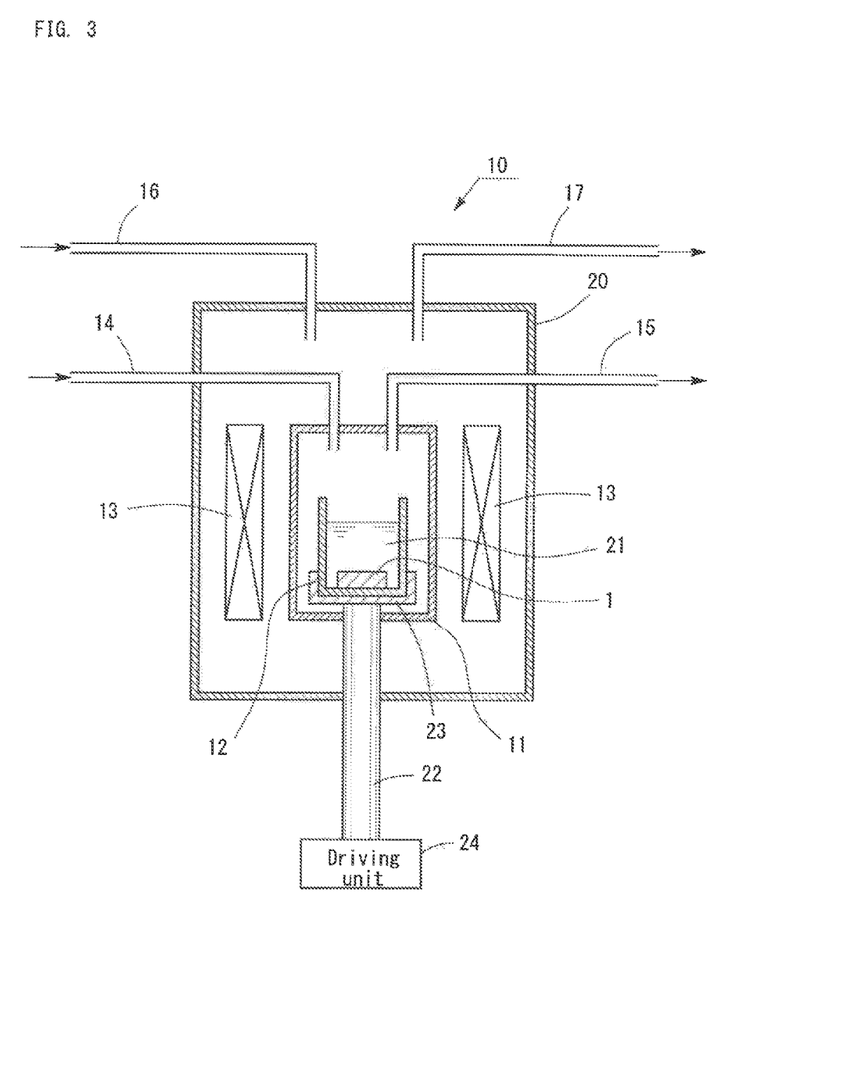
FIG. 3 is a sketch showing the structure of crystal production apparatus.

FIG. 3 is a sketch showing the structure of a crystal production apparatus 10 employed in producing the Group III nitride semiconductor through flux method. As shown in FIG. 3, the crystal production apparatus 10 includes a pressure container 20, a reaction vessel 11, a crucible 12, a heating apparatus 13, supply pipes 14 and 16, and discharge pipes 15 and 17.

The pressure container 20 is a pressure-resistant hollow cylinder made of stainless steel. To the pressure container 20, the supply pipe 16 and the discharge pipe 17 are connected. In the pressure container 20, the reaction vessel 11 and the heating apparatus 13 are disposed. Through placing the reaction vessel 11 in the pressure container 20 in this way, the reaction vessel 11 does not require particularly high pressure resistance. Thus, the reaction vessel 11 may be made of an inexpensive material, and recyclability is improved.

The reaction vessel 11 is made of SUS and has heat resistance. In the reaction vessel 11, the crucible 12 is placed. The crucible 12 is made of a material such as W (tungsten), Mo (molybdenum), BN (boron nitride), alumina, or YAG (yttrium aluminum garnet). The crucible 12 holds a molten mixture 21 containing an alkali metal and a Group III metal, and a seed substrate 1 is maintained in the molten mixture 21.

To the reaction vessel 11, the supply pipe 14 and the discharge pipe 15 are connected. Through operation of valves (not illustrated) attached to the supply pipe 14 and the discharge pipe 15, there are performed aeration in and feeding gas containing nitrogen into the reaction vessel 11, and controlling the pressure inside the reaction vessel 11. A gas containing nitrogen is also supplied to the pressure container 20 via the supply pipe 16. Through operation of valves (not illustrated) attached to the supply pipe 16 and the discharge pipe 17, the gas flow rate and discharge rate are controlled, thereby the pressure inside the pressure container 20 is substantially equalized with that of the reaction vessel 11. The temperature inside the reaction vessel 11 is controlled by means of the heating apparatus 13.

In the crystal production apparatus 10, there is provided an apparatus which can rotate the crucible 12 so as to stir the molten mixture 21 contained in the crucible 12, thereby the molten mixture 21 is stirred during the growth of a Group III nitride semiconductor crystal. By virtue of the apparatus, the molten mixture 21 can have a uniform alkali metal, Group III metal, or nitrogen concentration distribution profile, thereby a Group III nitride semiconductor crystal of uniform quality can be grown. The apparatus which can rotate the crucible 12 has a rotation axis 22, a turntable 23, and a driving unit 24. The rotation axis 22 extends from the inside of the reaction vessel 11 to the outside of the pressure container 20. The turntable 23 is disposed in the reaction vessel 11 and is connected to the rotation axis 22 so that it sustains the crucible 12. The driving unit 24 controls rotation of the rotation axis 22. The turntable 23 is rotated through rotation of the rotation axis 22 driven by the driving unit 24, thereby the crucible 12 sustained on the turntable 23 is rotated.

Meanwhile, when the employed reaction vessel 11 has pressure resistance, the pressure container 20 is not necessarily employed. In addition, in order to prevent vaporization of an alkali metal during growth of a Group III nitride semiconductor crystal, the crucible 12 may be provided with a lid. Instead of or in addition to the rotating means of the crucible 12, swinging means of the crucible 12 may be provided. The pressure container 20 and the reaction vessel 11 constitute a double container. By using a triple container, the growth conditions (such as temperature or pressure) may be further stabilized.

(Method for Producing a Group III Nitride Semiconductor)

The method for producing a Group III nitride semiconductor according to the present invention will next be described with reference to FIGS. 4A to 4C.

Firstly, prescribed amounts of an alkali metal, a Group III metal, and carbon are measured in the glove box under the controlled atmosphere such as oxygen density or dew point. After a seed substrate 1 is placed in a crucible 12, the measured prescribed amounts of an alkali metal and a Group III metal are placed in the crucible 12. The crucible 12 is housed in a transfer container and placed on the turntable 23 in the reaction vessel 11 without being exposed to the atmosphere.

Figure 7:
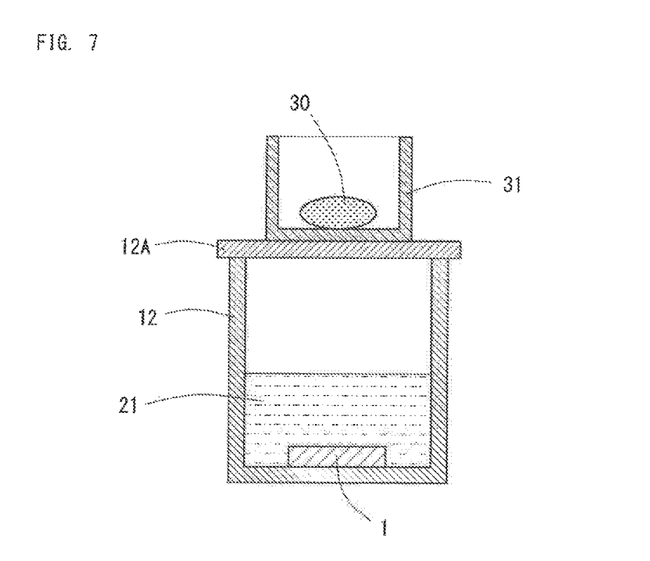
FIG. 7 is a sketch showing an example of carbon layout.
Figure 9:
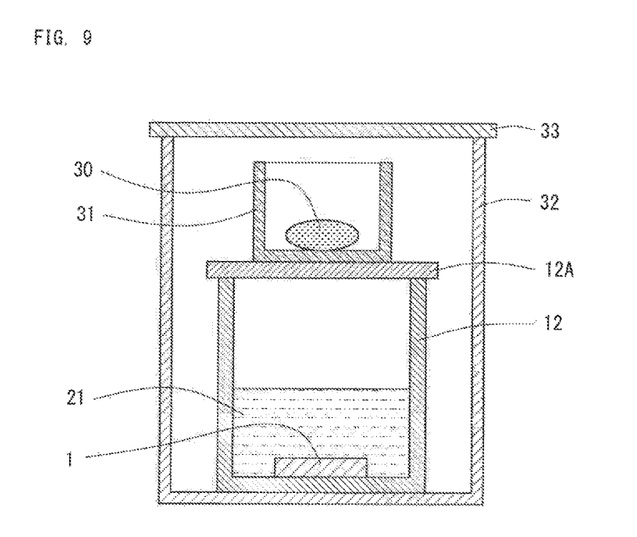
FIG. 9 is a sketch showing an example of carbon layout.
Figure 11:
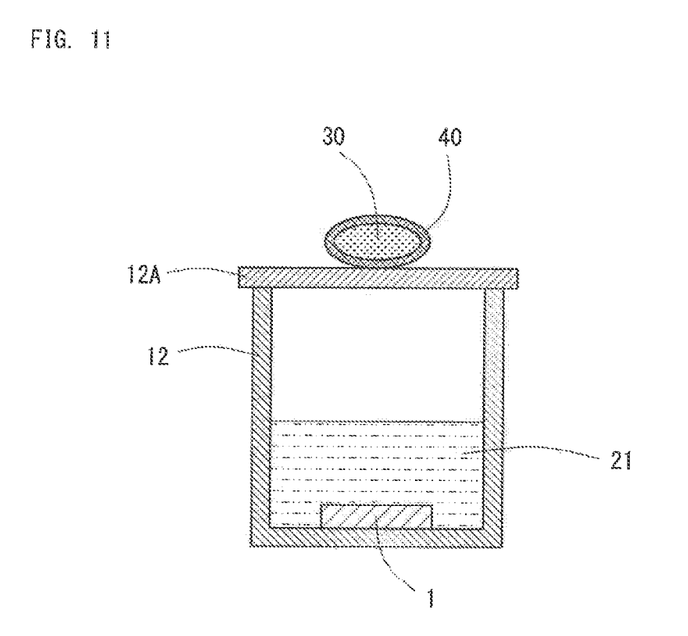
FIG. 11 is a sketch showing an example of carbon layout in Embodiment 1.
Figure 12:
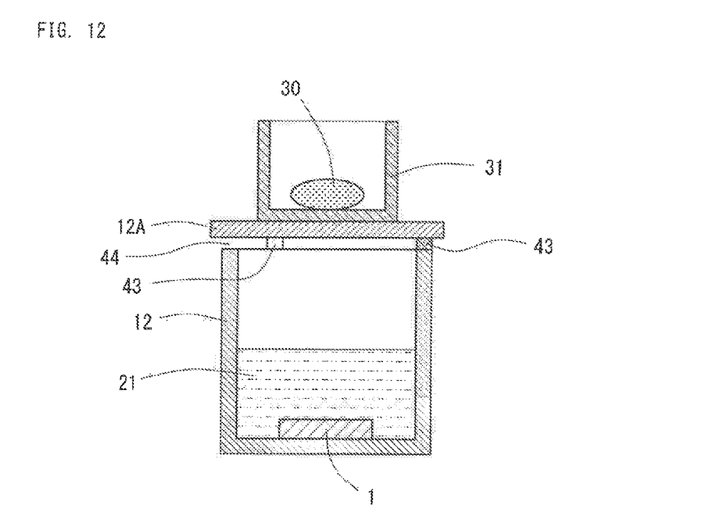
FIG. 12 is a sketch showing an example of carbon layout in Embodiment 5.

In the reaction vessel 11, carbon is placed so as not to contact with a molten mixture 21 at the start of crystal growth. One method is to place carbon outside the crucible 12. Carbon may be placed at any position as long as it is outside the crucible 12 in the reaction vessel 11, that is, in a range of sharing the atmosphere in contact with the molten mixture 21. For example, carbon is placed on a lid 12A of the crucible 12 (refer to FIGS. 7 and 11). In FIG. 7, powdered carbon 30 is placed in a crucible 31 as a holding container and placed on the lid 12A. As shown in FIG. 11, the carbon 30 may be placed directly on the lid 12A without using the crucible 31. In this case, as shown in FIG. 12, a clearance 44 may be formed using a spacer 43 between the upper end surface of the crucible 12 and the lid 12A. The amount of carbon being introduced in the crucible 12 can be controlled by the width of the clearance 44. Carbon is, for example, powdered or massive graphite. When powdered carbon is used, it is preferably wrapped in a mesh of a material capable of withstanding the high temperature such as SUS, Mo (molybdenum), and W (tungsten) so as not to scatter. More specifically, the employed mesh is made of a material having a melting point higher than the crystal growth temperature at the crystal growth pressure in the flux method and not reacting with nitrogen, an alkali metal, carbon or the like. The opening of the crucible 12 may be covered with this mesh instead of the lid of the crucible 12, and carbon may be placed on that. The crucible 12 and the crucible 31 may be placed in a container 32 a little larger than the whole of the crucible 12 and the crucible 31, and the container 32 may be covered with a lid 33 (refer to FIG. 9). Thereby, the efficiency of adding carbon to the molten mixture 21 is further enhanced.

Figure 10:
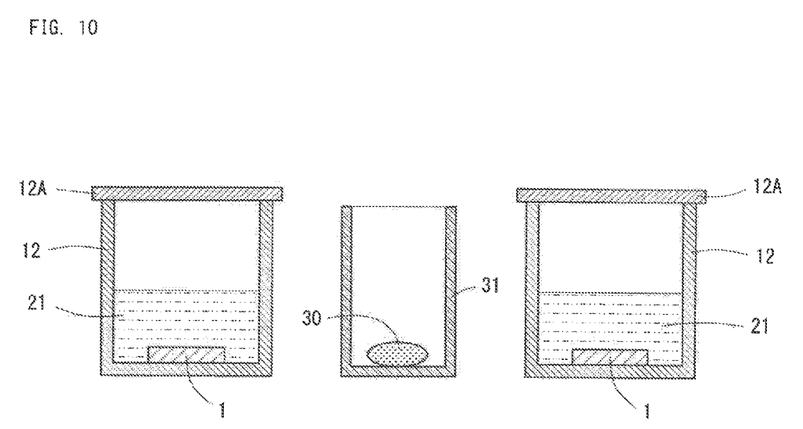
FIG. 10 is a sketch showing an example of carbon layout.

For example, the crucible 31 is prepared separately from the crucible 12 holding the seed substrate 1 and the molten mixture 21. In the crucible 31, the carbon 30 is introduced, and the crucible 12 is placed in proximity to the crucible 31 having the carbon 30 therein (refer to FIG. 8). Through this method, the amount of carbon being added to the molten mixture 21 can be easily adjusted by a distance between two crucibles 12 and 31. The amount of carbon being added to the molten mixture 21 can also be adjusted by providing a lid to the crucible 31 and adjusting a clearance between the lid and the crucible 31. A plurality of crucibles 12 holding the molten mixture 21 may be provided, and carbon may be added from one crucible 31 into the plurality of crucibles 12. FIG. 10 shows the case where two crucibles 12 are provided.

The other method is to apply carbon paste mixed with solvent to the top of the side wall of the crucible 12, and attach carbon to or suspend carbon from the back of the lid of the crucible 12.

The appropriate amount of carbon being placed is significantly affected by the layout of raw material or carbon. Therefore, the carbon amount is preferably appropriately adjusted, taking the layout into consideration. A larger amount of carbon is required than that in the conventional method where carbon is directly added to the molten mixture 21. The reason is that the molten mixture 21 in the crucible 12 and the carbon are spatially separated and a part of the carbon acts on the molten mixture 21. For example, the carbon amount is preferably 3.0 mol % or more to the alkali metal. As time passes, a sufficient amount of carbon can be added to the molten mixture 21.

After that, the reaction vessel 11 is sealed, and the reaction vessel 11 is enclosed in the pressure container 20. After evacuating the inside of the pressure container 20, the pressure and temperature of the pressure container 20 are increased. At this time, a gas containing nitrogen is supplied into the reaction vessel 11.

Next, the pressure and the temperature inside the reaction vessel 11 are increased to the temperature and pressure of crystal growth. The crystal growth temperature is 700° C. to 1,000° C., and the crystal growth pressure is 2 MPa to 10 MPa. At this time, the alkali metal and the Group III metal in the crucible 12 are melted to form a molten mixture 21. The molten mixture 21 is stirred by rotating the crucible 12 so that the molten mixture 21 has a uniform alkali metal or Group III metal concentration distribution profile. However, since the carbon 30 is placed as mentioned above, the carbon source (such as graphite powder) is not in contact with the molten mixture 21 at this point.

Figure 4A:
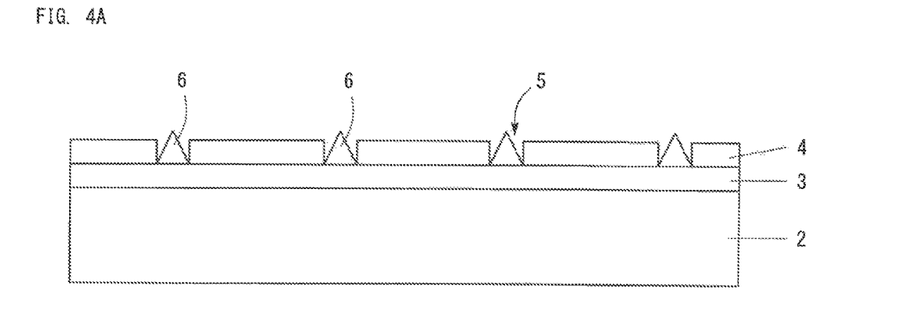
FIGS. 4A to 4C are sketches showing processes for producing a Group III nitride semiconductor.
Figure 4B:
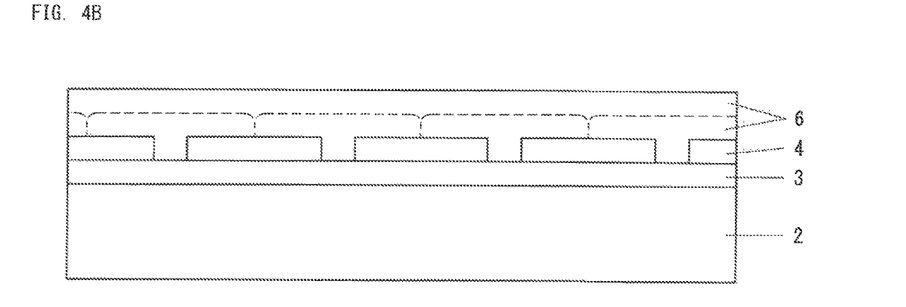
Figure 4C:
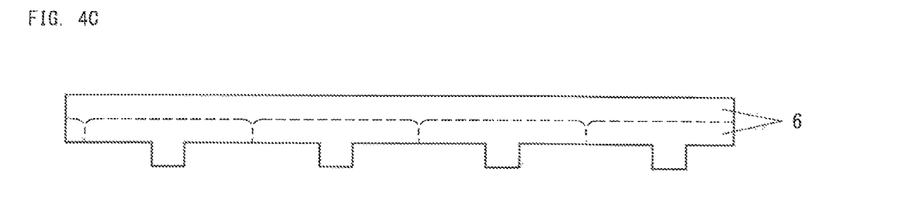

When nitrogen is melted in the molten mixture 21 to reach a supersaturation level, a Group III nitride semiconductor crystal 6 is epitaxially grown in a hexagonal pyramid shape on the surface of the Group III nitride semiconductor layer 3 exposed in each window 5 on the seed substrate 1 (refer to FIG. 4A). The Group III nitride semiconductor crystal 6 grown in a hexagonal pyramid shape from each seed crystal region is mainly laterally grown in a hexagonal columnar shape, and the adjacent hexagonal columnar crystals are integrated into one Group III nitride semiconductor crystal 6 having a flat surface (refer to FIG. 4B). At this time, lateral growth is dominant so that dislocations in the Group III nitride semiconductor are laterally bent. Thereby, the dislocation density is reduced, and the crystallinity is improved.

In growing the Group III nitride semiconductor crystal 6, carbon is not added to the molten mixture 21 at an initial stage of the crystal growth because the carbon 30 is placed as mentioned above. However, as time passes, carbon is gradually added to the molten mixture 21, and the carbon amount is increased in the molten mixture 21. As a result, the growth rate of the Group III nitride semiconductor crystal 6 is gradually increased. The route where the carbon 30 placed outside the crucible 12 is added to the molten mixture 21, is unknown. However, it is assumed that carbon itself or a product reacted with carbon is transported in the crucible 12 and added to the molten mixture 21 via a gas containing nitrogen or the atmosphere containing the evaporated alkali metal.

In the method for producing a Group III nitride semiconductor according to the present invention, the amount of carbon added to the molten mixture 21 is zero at the start of crystal growth, and the amount of carbon added is gradually increased. As a result, in the Group III nitride semiconductor crystal 6 on the seed substrate 1, ungrown region or abnormal grain growth region is reduced. As the amount of carbon added is increased, the growth rate is gradually increased, thereby the Group III nitride semiconductor crystal 6 can be efficiently grown. The reason for that is assumed as follows.

For the seed substrate 1 having seed crystal regions scattered in a dotted pattern, the area of the seed crystal regions is smaller than that in the case where the entire surface of the seed substrate 1 is the seed crystal region, and the seed crystal regions and other regions are present as mixed. Therefore, a local concentration distribution profile of the raw material is generated in the molten mixture 21. As a result, the conditions appropriate for crystal growth of the Group III nitride semiconductor are different from the conditions in the case when the entire surface of the seed substrate 1 is the seed crystal region.

In the present invention, carbon is placed so as not to contact with the molten mixture 21, and carbon is not added to the molten mixture 21 at an initial stage of crystal growth. Thereby, the degree of supersaturation at an initial stage of crystal growth of the Group III nitride semiconductor, or excessive free energy being the driving force of growth is suppressed so that the driving force of crystal growth per the area of the seed substrate 1 is appropriately maintained. As a result of suppression of the growth rate, the growth rate is made uniform so that there is no crystal produced by abnormal grain growth, thereby the concentration distribution profile of the raw material (Group III metal or nitrogen) in the molten mixture is made uniform. As mentioned above, the concentration distribution profile of the raw material in the molten mixture 21 is decreased, and the growth rate of the Group III nitride semiconductor is suppressed to be uniform. Therefore, there is no region where the Group III nitride semiconductor crystal is not grown on the seed substrate 1, and abnormal grain growth region is also decreased.

Carbon is gradually added to the molten mixture 21, and the amount of carbon is increased. The growth rate is also gradually increased, thereby the Group III nitride semiconductor crystal 6 can be efficiently grown in the present invention. Ungrown region or abnormal grain growth region is reduced in the Group III nitride semiconductor crystal 6, and crystal growth is further promoted with such regions as nuclei. Therefore, even if the growth rate is increased, ungrown region or abnormal grain growth region is not newly occurred. Since carbon is indirectly supplied to the molten mixture 21, there is little variation in the carbon concentration profile in the molten mixture 21, and the seed substrate 1 is not locally melted back. This can further improve the crystal quality of the Group III nitride semiconductor crystal 6.

Since the amount of carbon added is gradually increased, the leakage of the alkali metal to outside the crucible 12 is also suppressed. As a result of studies, the inventors found that when the amount of carbon added to the molten mixture 21 is small, particularly when carbon of 0.3 mol % or less is added to the alkali metal, it is more likely that the alkali metal creeps up on the side wall of the crucible 12 and leaks to outside the crucible 12. The leakage of the alkali metal causes the following problems. The alkali metal enters a clearance between the lid and the crucible 12, so that the lid does not open or the growth of the Group III nitride semiconductor crystal 6 becomes unstable. The present invention can suppress the leakage of the alkali metal, thereby stabilizing the growth of the Group III nitride semiconductor crystal 6.

Subsequently, heating of the reaction vessel 11 was stopped, to return the conditions to be ambient temperature and pressure. Thus, growth of the Group III nitride semiconductor was terminated. The top surface of the Group III nitride semiconductor layer 3 of the seed substrate 1 is covered with a mask 4 having windows 5, the grown Group III nitride semiconductor crystal 6 is partially in contact with the Group III nitride semiconductor layer 3 via the windows 5, and other parts are in contact with the mask 4. There is a difference between the linear expansion coefficient of the mask 4 of the seed substrate 1 and that of the grown Group III nitride semiconductor crystal 6. Therefore, when temperature decreases after termination of growth, the grown Group III nitride semiconductor crystal 6 may be naturally peeled off from the seed substrate 1. Even if not peeled off, by applying a light shock, the grown Group III nitride semiconductor crystal 6 can be peeled off from the seed substrate 1 (refer to FIG. 4C).

With using the grown Group III nitride semiconductor crystal 6 as the seed substrate 1, a Group III nitride semiconductor crystal may be grown again using the method for producing a Group III nitride semiconductor of the present invention. A Group III nitride semiconductor crystal having a higher quality can be obtained.

Hereinafter, specific embodiments of the present invention will be described with reference to the drawings. However, these embodiments are given only for the purpose of illustration and should not be construed as limiting the invention thereto.

Embodiment 1

Figure 5A:
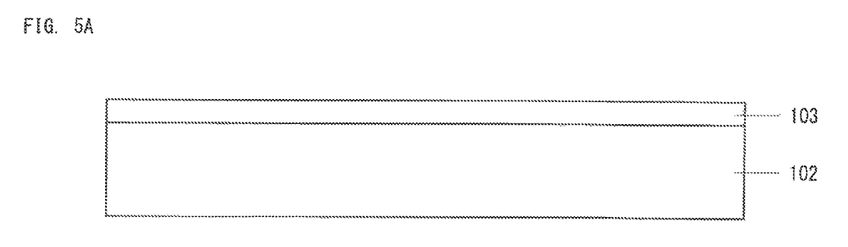
FIGS. 5A to 5C are sketches showing processes for producing a seed crystal.

The method for producing a GaN crystal according to Embodiment 1 will be described with reference to FIGS. 5 and 6.

Firstly, a seed substrate 1 for growing a GaN crystal was prepared as follows. A ground substrate 102 made of sapphire having a diameter of two inches and a thickness of 1 mm was prepared. On the ground substrate 102, an AlN buffer layer (not illustrated) and a GaN layer 103 were sequentially formed through MOCVD (FIG. 5A). The thickness of the GaN layer 103 was 5 μm. In MOCVD, ammonia gas ($NH_3$) was employed as a nitrogen source. Trimethylgallium ($Ga(CH_3)_3$: TMG) was employed as a Ga source. Trimethylaluminum ($Al(CH_3)_3$: TMA) was employed as an Al source. Hydrogen ($H_2$) was employed as a carrier gas.

Figure 5B:
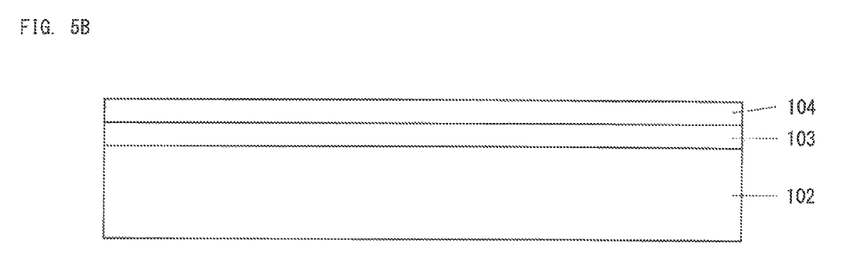
Figure 6A:
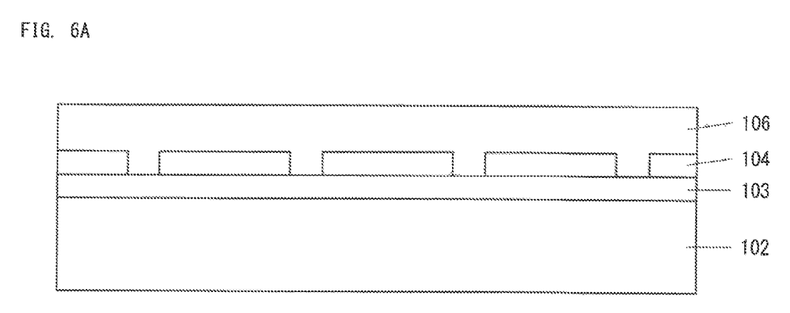
FIGS. 6A and 6B are sketches showing processes for producing a GaN crystal according to Embodiment 1.
Figure 6B:
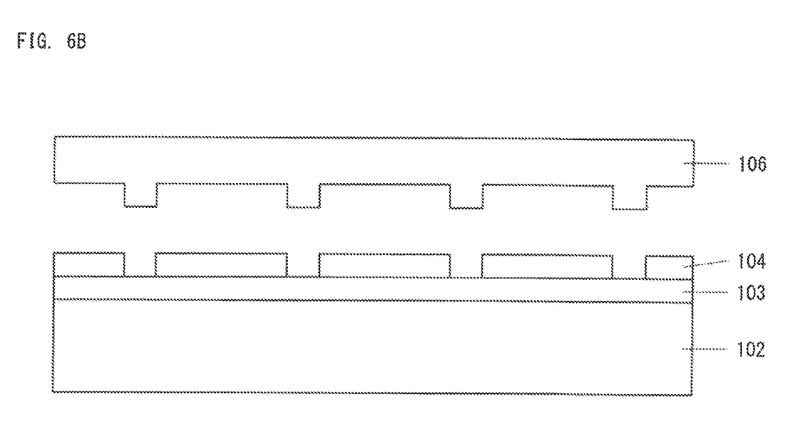

Next, through ALD, on the GaN layer 103, a mask 104 made of $Al_2O_3$ was formed (FIG. 5B). The thickness of the mask 104 was 0.1 μm.

Subsequently, the mask 104 was patterned through photolithography or wet etching to form windows 105 in a triangular lattice pattern. In each window 105, the surface of the GaN layer 103 was exposed (FIG. 5C). Thus, the surface of the GaN layer 103 being the seed crystal regions were scattered in a dotted pattern. Each window 105 was a circle having a diameter W1 of 0.1 mm, and a distance W2 between the windows 105 was 0.09 mm. Through the above procedure, the seed substrate 1 was prepared.

Subsequently, as shown in FIG. 11, the seed substrate 1 was placed in a crucible 12, and a Group III nitride semiconductor was grown through a flux method on the seed substrate 1. The crystal growth temperature was 860° C., and the crystal growth pressure was 3 MPa. Na of 16.7 g was used as an alkali metal, Ga of 11.0 g was used as a Group III metal, and nitrogen gas was supplied. As shown in FIG. 11, powdered carbon 30 was wrapped in a mesh 40 made of W (tungsten) and placed on a lid 12A of the crucible 12. The lid 12A is not in close contact with the crucible 12, and there is a little clearance between the lid 12A and the crucible 12. Through this clearance, gas is introduced into the crucible 12. In Embodiments 2, 3, and 4 as well, there is a clearance between the crucible 12 and the lid 12A. The growth time was 40 hours. The crucible 12 was made of alumina. Thus, a GaN crystal 106 was grown on each area of GaN layer 103 exposed in each window 105 of the seed substrate 1, and the grown GaN crystals 106 were integrated into one GaN crystal 106 having a flat surface on the seed substrate 1 (refer to FIG. 6A).

After termination of growth, the crucible 12 was taken out after the temperature was cooled down to ambient temperature. Na and Ga were removed with ethanol or the like. The GaN crystal 106 was peeled off from the seed substrate 1, and was self-supported without cracks (refer to FIG. 6B). The growth rate of the GaN crystal was 8 μm/h.

Comparative Example 1

In Comparative Example 1, a GaN crystal was grown on the seed substrate 1 having the same structure through a flux method under the same growth conditions as employed in Embodiment 1 except for the following. C of 0.6 mol % to Na was directly added to the crucible 12. The GaN crystals grown on the seed crystal regions were integrated into one, and the growth rate of the GaN crystal was 13 μm/h.

Comparative Example 2

In Comparative Example 2, a GaN crystal was grown on the seed substrate 1 having the same structure through a flux method under the same growth conditions as employed in Embodiment 1 except for the following. In Comparative Example 2, a GaN crystal was grown without adding carbon to the crucible 12 and without placing carbon outside the crucible 12. The GaN crystals grown on the seed crystal regions were integrated into one, and the growth rate of the GaN crystal was 2 μm/h.

The GaN crystal 106 grown according to Embodiment 1 and the GaN crystals grown according to Comparative Examples 1 and 2 were compared by visual observation and by observation with an optical microscope. As a result, the GaN crystal grown according to Comparative Example 1 contains a lot of ungrown region or abnormal grain growth region, and inclusion (molten mixture included in the crystal and mainly comprising Na), and the GaN crystal had large irregularities on the surface thereof. The GaN crystal grown according to Comparative Example 2 was grown in an almost uniform periodical hexagonal column on each seed crystal region, and the GaN crystal had little irregularities on the surface thereof. However, a part area of the crystal was not integrated into one due to insufficient crystal growth. Dotted holes due to peeling in the cleaning step of the seed substrate 1 were found in the crystal. The GaN crystal of Comparative Example 2 was thin and the growth efficiency was poor.

On the other hand, the GaN crystal 106 grown according to Embodiment 1 had slightly larger irregularities on the surface thereof compared to those of Comparative Example 2. The irregularities were periodically arranged and had a small good distribution on the surface thereof. The crystal growth on each seed crystal region was uniform, and was sufficiently promoted. Therefore, there is no region where the grown crystals were not integrated into one, and a continuous integrated crystal was formed. The dotted crystal holes due to peeling by cleaning the seed substrate 1 were not found. Compared to Comparative Example 2, the GaN crystal 106 was thicker and efficiently grown.

Comparing Embodiment 1 and Comparative Examples 1 and 2, C was not added to the molten mixture 21 at an initial stage of crystal growth in Embodiment 1, thereby ungrown region or abnormal grain growth region was reduced. It was found that through such crystal growth, a GaN crystal 106 having a high surface flatness could be formed, and the yield ratio was drastically improved. It was also found that a GaN crystal 106 was uniformly grown on each seed crystal region exposed in each window 5, and the surface flatness of the grown GaN crystal 106 was improved. In Embodiment 1, it was found that since C was gradually added to the molten mixture 21 as time passes, the crystal growth rate was increased, thereby the GaN crystal 106 could be efficiently grown.

Embodiment 2

Instead of the seed substrate 1 according to Embodiment 1, a free-standing seed substrate made of GaN was employed as a substrate. A GaN crystal was grown on the seed substrate same as in Embodiment 1. However, the mask 104 was not formed on the seed substrate. When the grown GaN crystal was observed visually and with an optical microscope, ungrown region or abnormal grain growth region, and inclusion were hardly found. The GaN crystal had little irregularities on the surface thereof and had a high surface flatness. The thickness of the GaN crystal was the same as in Embodiment 1, and the GaN crystal could be efficiently grown.

Embodiment 3

Instead of the seed substrate 1 according to Embodiment 1, the seed substrate 1 having no mask 4 was employed as a seed substrate. That is, a template substrate with the entire surface of the GaN layer 103 exposed was employed. A GaN crystal was grown on the seed substrate in the same way as in Embodiment 1. When the grown GaN crystal was observed visually and with an optical microscope, same as in Embodiment 2, ungrown region or abnormal grain growth region, and inclusion were hardly found. The GaN crystal had little irregularities on the surface thereof and had a high surface flatness. The thickness of the GaN crystal was the same as in Embodiment 1, and the GaN crystal could be efficiently grown.

Embodiment 4

Figure 8:
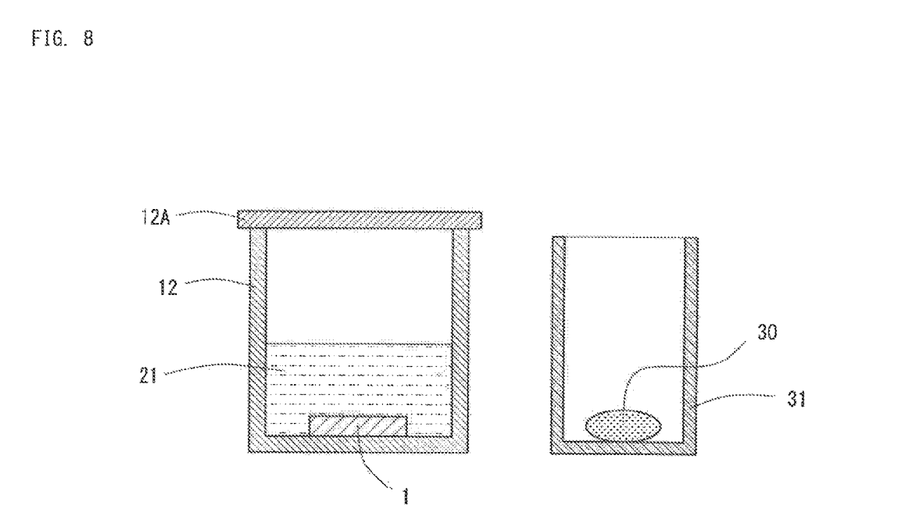
FIG. 8 is a sketch showing an example of carbon layout.

Separately from the crucible 12 for holding the seed substrate 1 and the molten mixture 21, as shown in FIG. 8, a crucible 31 for holding carbon was prepared. In the crucible 31, powered carbon 30 was placed. In the present embodiment, the powdered carbon 30 was not wrapped in the mesh 40 unlike Embodiments 1 to 3. The crucible 12 was placed in proximity to the crucible 31 holding powdered carbon. In the same way as in Embodiment 1, a GaN crystal was grown on the seed substrate 1. When the grown GaN crystal was observed visually and with an optical microscope, same as in Embodiment 1, ungrown region or abnormal grain growth region, and inclusion were hardly found. The GaN crystal had little irregularities on the surface thereof and had a high surface flatness. The thickness of the GaN crystal was the same as in Embodiment 1, and the GaN crystal could be efficiently grown.

In the method for producing GaN crystal according to Embodiment 4, there is an advantage that the amount of carbon being added to the molten mixture 21 can be controlled by adjusting a distance between the crucible 12 and the crucible 31 holding the powered carbon 30.

As shown in FIG. 7, when the crucible 31 holding the powered carbon 30 was placed on the lid 12A and a GaN was grown in the same way, the same effect was obtained as in Embodiment 1.

Embodiment 5

Figure 5C:
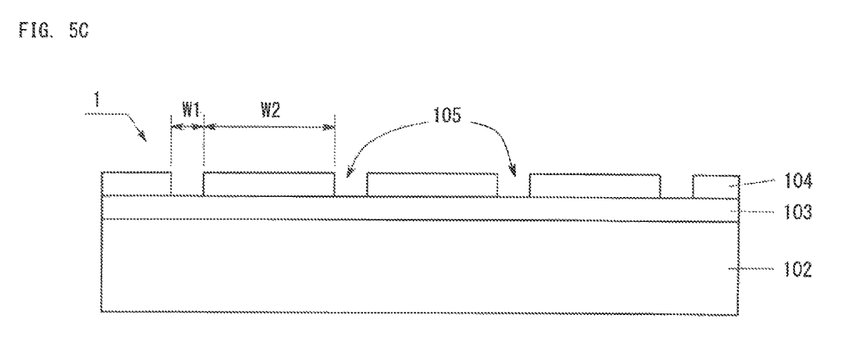

In the present embodiment, a seed substrate having the same structure as that of Embodiment 1 shown in FIG. 5C was employed. That is, the substrate prepared by epitaxially growing GaN on a sapphire substrate and forming a patterned mask thereon was employed. The weight of the raw materials in the crucible 12, the growth temperature, the growth pressure and other conditions were the same as those in Embodiment 1. A crucible 31 for holding carbon was prepared separately from the crucible 12 for holding the seed substrate 1 and the molten mixture 21. Powdered carbon 30 was placed in the crucible 31. The powdered carbon 30 was not wrapped in a mesh 40. Spacers 43 were provided at three positions at 120° interval in a cross section vertical to the axis of the crucible 12 on the upper end surface of the crucible 12. By the spacers 43, a clearance of 1 mm between the upper end surface of the crucible 12 and the lid 12A was formed. In the same way as in Embodiment 1, a GaN crystal was grown on the seed substrate 1. The growth rate of the GaN crystal was 11.3 μm/h. When the grown GaN crystal was observed visually and with an optical microscope, an extremely small amount (4 mg) of miscellaneous crystal was found.

For comparison, a GaN was grown using a crucible 12 having a clearance 44 of 1 mm between the upper end surface of the crucible 12 and the lid 12A, and placing powdered carbon directly in the crucible 12. The growth rate of the GaN crystal was 11.6 μm/h. No miscellaneous crystal was found. It was found from this that even if the powdered carbon was placed outside the crucible 12 and the clearance 44 was positively provided between the crucible 12 and the lid 12A, a good GaN crystal was obtained.

The appropriate width of the clearance 44 between the upper end surface of the crucible and the lid 12A is 0.2 mm to 10 mm. When the width of the clearance 44 is too large, the leakage of Na to outside the crucible 12 by evaporation increases too much. Therefore, the width of the clearance 44 is preferably appropriately selected according to the growth temperature or pressure.

Figure 13:
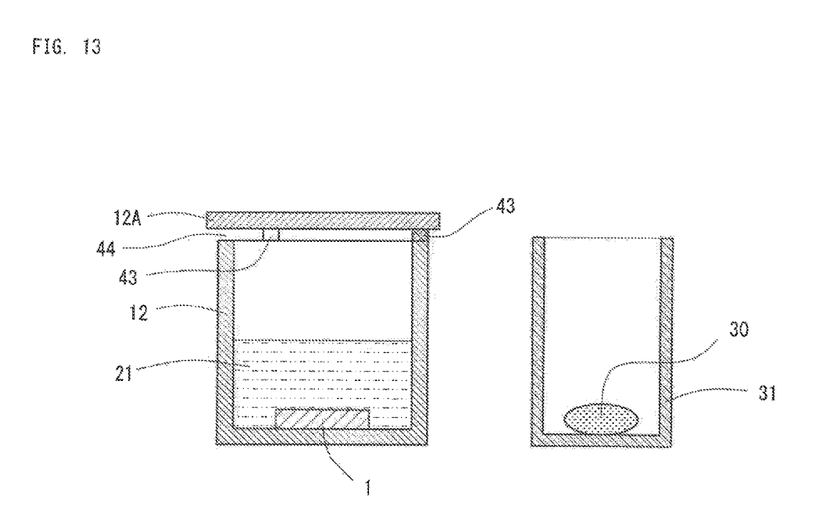
FIG. 13 is a sketch showing an example of carbon layout in Embodiment 5.

By intentionally (positively) providing the clearance 44, compared to Embodiment 1, the amount of carbon being introduced in the crucible 12 is increased. However, by placing the powered carbon outside the crucible 12, a good GaN can be obtained. By changing the width of the clearance 44, the amount of carbon being introduced in the crucible 12 can be controlled. As shown in FIG. 13, the clearance 44 may be provided between the upper end surface of the crucible 12 and the lid 12A and the crucible 31 holding the powdered carbon 30 may be placed on the same plane as the placed plane of the crucible 12 same as in Embodiment 1. Even in this case, a good GaN crystal is obtained.

Variation

In Embodiment 1, carbon was placed so as not to contact with the molten mixture at the start of growth, thereby making the carbon concentration of the molten mixture before the start of growth zero and gradually increasing the carbon concentration of the molten mixture after the start of growth. The present invention is not limited to this. Any method may be employed as long as the carbon concentration of the molten mixture is made to zero before the start of growth, and the carbon concentration of the molten mixture is gradually increased after the start of growth. The increase of the carbon concentration is preferably continuous. In the above, the carbon concentration being zero does not mean that the carbon concentration is completely zero, but that carbon concentration is low to a degree that carbon is not identified as intentionally added.

The present invention may be applied to a method such as dipping method where the seed crystal and the molten mixture are separated at an initial stage of growth, and after that, the seed crystal is brought into contact with the molten mixture. In this case, there is an advantage that the carbon concentration of the molten mixture is uniform.

The Group III nitride semiconductor grown according to the present invention can be employed as a growth substrate of Group III nitride semiconductor device.

What is claimed is:

1. A method for producing a Group III nitride semiconductor comprising growing a Group III nitride semiconductor through a flux method using a molten mixture of an alkali metal and a Group III metal on a seed substrate, wherein a first crucible with a lid is used to hold the seed substrate and the molten mixture, carbon being a graphite which is measured in a predetermined amount is placed on the lid of the first crucible so as not to contact with the molten mixture at start of growth so that a carbon concentration of the molten mixture is made to zero before the start of growth, and the Group III nitride semiconductor is grown on the seed substrate while increasing the carbon concentration of the molten mixture after the start of growth.

2. A method for producing a Group III nitride semiconductor comprising growing a Group III nitride semiconductor through a flux method using a molten mixture of an alkali metal and a Group III metal on a seed substrate, wherein a first crucible comprising at least one selected from a group consisting of tungsten(W), molybdenum(Mo), boron nitride (BN), alumina, and yttrium aluminum garnet(YAG) is used to hold the seed substrate and the molten mixture, the first crucible is set in a reaction vessel, the reaction vessel is heated by a heating apparatus disposed outside of the reaction vessel, carbon being a graphite which is measured in a predetermined amount is placed at any place in the reaction vessel so as not to contact with the molten mixture at start of growth so that a carbon concentration of the molten mixture is made to zero before the start of growth, and the Group III nitride semiconductor is grown on the seed substrate while increasing the carbon concentration of the molten mixture after the start of growth.

3. The method for producing a Group III nitride semiconductor according to claim 1, wherein a clearance is formed between an upper end surface of the first crucible and the lid.

4. A method for producing a Group III nitride semiconductor comprising growing a Group III nitride semiconductor through a flux method using a molten mixture of an alkali metal and a Group III metal on a seed substrate, wherein carbon is placed so as not to contact with the molten mixture at start of growth so that a carbon concentration of the molten mixture is made to zero before the start of growth, and the Group III nitride semiconductor is grown on the seed substrate while increasing the carbon concentration of the molten mixture after the start of growth, and
wherein the carbon is powdered.

5. The method for producing a Group III nitride semiconductor according to claim 2, wherein the seed substrate has seed crystal regions as starting point of epitaxial growth scattered in a dotted pattern.

6. The method for producing a Group III nitride semiconductor according to claim 5, wherein the seed substrate has a ground substrate, a Group III nitride semiconductor layer disposed on the ground substrate, and a mask disposed on the Group III nitride semiconductor layer, and the mask has a plurality of windows arranged in a triangular lattice pattern.

7. The method for producing a Group III nitride semiconductor according to claim 6, wherein the mask is formed through atomic layer deposition (ALD).

8. The method for producing a Group III nitride semiconductor according to claim 7, wherein the mask is made of $Al_2O_3$, $TiO_2$, or $ZrO_2$.

9. The method for producing a Group III nitride semiconductor according to claim 2, wherein the seed substrate is a free-standing substrate made of Group III nitride semiconductor.

10. The method for producing a Group III nitride semiconductor according to claim 2, wherein a diameter of the seed substrate is two inches or more.

11. A method for producing a Group III nitride semiconductor comprising growing a Group III nitride semiconductor through a flux method using a molten mixture of an alkali metal and a Group III metal on a seed substrate, wherein a first crucible is used to hold the seed substrate and the molten mixture, a second crucible which does not contain the molten mixture but contains carbon being a graphite in an inner space thereof is used, the carbon does not contact with the molten mixture at start of growth so that a carbon concentration of the molten mixture is made to zero before the start of growth, and the Group III nitride semiconductor is grown on the seed substrate while increasing the carbon concentration of the molten mixture after the start of growth.

12. The method for producing a Group III nitride semiconductor according to claim 11, wherein the second crucible is placed in a proximity to the first crucible in a container in which the first crucible is placed.

13. The method for producing a Group III nitride semiconductor according to claim 11, wherein the first crucible has a lid and the second crucible is placed on the lid.

14. The method for producing a Group III nitride semiconductor according to claim 13, wherein a clearance is formed between an upper end surface of the first crucible and the lid.

15. The method for producing a Group III nitride semiconductor according to claim 4, wherein the carbon is wrapped in a mesh.

16. The method for producing a Group III nitride semiconductor according to claim 4, wherein a second crucible for holding carbon in an inner space thereof is used.

17. The method for producing a Group III nitride semiconductor according to claim 16, wherein the second crucible is placed in a proximity to the first crucible in a container in which the first crucible is placed.

18. The method for producing a Group III nitride semiconductor according to claim 16, wherein the first crucible has a lid and the second crucible is placed on the lid.

19. The method for producing a Group III nitride semiconductor according to claim 18, wherein a clearance is formed between an upper end surface of the first crucible and the lid.

20. The method for producing a Group III nitride semiconductor according to claim 4, wherein the seed substrate has seed crystal regions as a starting point of epitaxial growth scattered in a dotted pattern.

* * * * *